United States Patent
Zhu et al.

(10) Patent No.: US 9,064,954 B2
(45) Date of Patent: Jun. 23, 2015

(54) SEMICONDUCTOR DEVICES AND METHODS FOR MANUFACTURING THE SAME

(71) Applicants: Huilong Zhu, Poughkeepsie, NY (US); Qingqing Liang, Lagrangeville, NY (US); Huicai Zhong, San Jose, CA (US)

(72) Inventors: Huilong Zhu, Poughkeepsie, NY (US); Qingqing Liang, Lagrangeville, NY (US); Huicai Zhong, San Jose, CA (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 188 days.

(21) Appl. No.: 13/623,567

(22) Filed: Sep. 20, 2012

(65) Prior Publication Data

US 2013/0341713 A1    Dec. 26, 2013

Related U.S. Application Data

(63) Continuation of application No. PCT/CN2012/077852, filed on Jun. 29, 2012.

(30) Foreign Application Priority Data

Jun. 20, 2012 (CN) .......................... 2012 1 0210600

(51) Int. Cl.
*H01L 29/78* (2006.01)
*H01L 29/66* (2006.01)
*H01L 29/165* (2006.01)

(52) U.S. Cl.
CPC ........ *H01L 29/7816* (2013.01); *H01L 29/6653* (2013.01); *H01L 29/66537* (2013.01);
(Continued)

(58) Field of Classification Search
CPC ............ H01L 29/7816; H01L 29/6653; H01L 29/66545; H01L 29/6659; H01L 29/165; H01L 29/66659; H01L 29/7848; H01L 29/66636
USPC ......................................... 257/335; 438/286
See application file for complete search history.

(56) References Cited

U.S. PATENT DOCUMENTS 7,056,794 B2    6/2006 Ku et al.
2011/0141806 A1    6/2011 Kim
(Continued)

FOREIGN PATENT DOCUMENTS

CN    1638049 A    7/2005
CN    102376575 A    3/2012
(Continued)

OTHER PUBLICATIONS

International Search Report dated Mar. 28, 2013, issued in Int'l Application No. PCT/CN2012/077852.
(Continued)

*Primary Examiner* — Walter H Swanson
(74) *Attorney, Agent, or Firm* — Knobbe Martens Olson & Bear LLP

(57) ABSTRACT

Semiconductor devices and methods for manufacturing the same are disclosed. In one embodiment, a method includes forming a first shielding layer on a substrate. The method further includes forming one of source and drain regions, which is stressed, with the first shielding layer as a mask. The method further includes forming a second shielding layer on the substrate, and forming the other of the source and drain regions with the second shielding layer as a mask. The method further includes removing a portion of the second shielding layer which is next to the other of the source and drain regions. The method further includes forming a gate dielectric layer, and forming a gate conductor as a spacer on a sidewall of a remaining portion of the second shielding layer.

5 Claims, 12 Drawing Sheets

(52) U.S. Cl.
CPC ...... *H01L29/66545* (2013.01); *H01L 29/6659* (2013.01); *H01L 29/66636* (2013.01); *H01L 29/66659* (2013.01); *H01L 29/7834* (2013.01); *H01L 29/7835* (2013.01); *H01L 29/7848* (2013.01); *H01L 29/165* (2013.01)

(56) References Cited

U.S. PATENT DOCUMENTS

| | | | | |
|---|---|---|---|---|
| 2011/0193162 | A1* | 8/2011 | Chuang et al. | 257/343 |
| 2012/0091514 | A1* | 4/2012 | Liang et al. | 257/279 |
| 2012/0146054 | A1 | 6/2012 | Nawaz et al. | |
| 2012/0196432 | A1* | 8/2012 | Yan | 438/586 |
| 2012/0223331 | A1* | 9/2012 | Zhu et al. | 257/77 |
| 2012/0252198 | A1* | 10/2012 | Zhu et al. | 438/585 |

FOREIGN PATENT DOCUMENTS

| WO | WO 2012000302 | * | 1/2012 |
|---|---|---|---|
| WO | WO 2012062021 | * | 5/2012 |

OTHER PUBLICATIONS

Written Opinion dated Mar. 28, 2013, issued in Int'l Application No. PCT/CN2012/077852.

* cited by examiner

SEMICONDUCTOR DEVICES AND METHODS FOR MANUFACTURING THE SAME

CROSS-REFERENCE TO RELATED APPLICATIONS

This application is a continuation and claims benefit under 35 U.S.C. §§120 and 365 of PCT Application No. PCT/CN2012/077852, filed Jun. 29, 2012, which is herein incorporated by reference in its entirety and which claims priority to Chinese Application No. 201210210600.1, entitled "SEMICONDUCTOR DEVICES AND METHODS FOR MANUFACTURING THE SAME," filed on Jun. 20, 2012, which is incorporated herein by reference in its entirety.

BACKGROUND

1. Field of the Invention

The present disclosure relates to the semiconductor field, and particularly, to semiconductor devices and methods for manufacturing the same.

2. Description of the Related Technology

With continuous scaling down of semiconductor devices, short channel effects are becoming more significant. Thus, a gate stack configuration comprising a high-K gate dielectric and a metal gate conductor is proposed. To avoid degradation of the gate stack, semiconductor devices with such a gate stack configuration are manufactured generally by way of the replacement gate process. The replacement gate process involves filling the high-K dielectric and the metal gate conductor in a gap defined between gate spacers. However, it is becoming more and more difficult to fill the high-K dielectric and the metal gate conductor in the small gap due to the scaling down of the semiconductor devices.

SUMMARY OF CERTAIN ASPECTS OF THE INVENTION

The present disclosure provides, among others, semiconductor devices and methods for manufacturing the same.

According to an aspect of the present disclosure, there is provided a method for manufacturing a semiconductor device, including forming a first shielding layer on a substrate. The method further includes forming one of source and drain regions, which is stressed, with the first shielding layer as a mask. The method further includes forming a second shielding layer on the substrate, and forming the other of the source and drain regions with the second shielding layer as a mask. The method further includes removing a portion of the second shielding layer which is next to the other of the source and drain regions; forming a gate dielectric layer, and forming a gate conductor as a spacer on a sidewall of a remaining portion of the second shielding layer.

According to a further aspect of the present disclosure, there is provided a semiconductor device. The semiconductor device includes a substrate and source and drain regions and a gate stack formed on the substrate. The gate stack includes a gate dielectric layer and a gate conductor, which is formed as a spacer on a sidewall of a dielectric layer or a gate spacer on one side of the gate stack. One of the source and drain regions on the one side of the gate stack is stressed.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION OF CERTAIN INVENTIVE EMBODIMENTS

Figure 1:
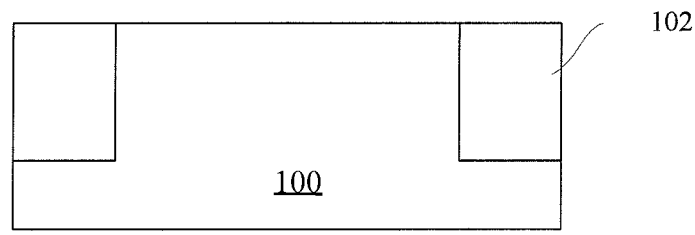
FIGS. 1-12 are schematic views showing a method of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

In the conventional process, after source and drain regions are formed in a substrate with the aid of a "dummy" gate stack and spacers on opposite sides of the dummy gate stack, the spacers are reserved to define a gap therebetween, and a true gate stack can be formed by filling the gap. In contrast, the present disclosure proposes a "replacement spacer" process. Specifically, after source and drain regions are formed, material layer(s) present on the side of either one of the source and drain regions is (are) reserved, and a gate stack (particularly, a gate conductor) is formed as a spacer on a sidewall of the reserved material layer(s). In this way, formation of the gate stack is done in a relatively large space (substantially corresponding to a gate region+the other of the source and drain regions). This process is easier to perform as compared with the conventional process where formation of the gate stack is done in the small gap between the spacers.

According to embodiments of the present disclosure, the source and drain regions can be formed in an active region of the substrate by way of shielding layer(s). For example, a first shielding layer may be adopted to mask the active region to expose a portion of the active region, which can be processed to form one of the source and drain regions. Further, a second shielding layer may be adopted to mask the active region to expose another portion of the active region, which can be processed to form the other of the source and drain regions.

The first and second shielding layers can be formed in various ways, provided that they can shield the active region to expose the respective portions of the active region. In this way, the first and second shielding layers serve as masks in the source/drain formation process. Further, the second shielding layer may comprise some portion(s) from the first shielding layer.

When the source and drain regions are formed as described above, the second shielding layer can be patterned so that a portion thereof is removed, to further expose a further portion of the active region. On the exposed further portion, a gate stack can be formed. For example, the gate stack may be formed by a spacer formation process. For convenience of patterning the second shielding layer, the second shielding layer may preferably comprise several portions of different materials, at least some of which have etching selectivity with respect to each other so that some of them can be removed selectively.

The technology of the present disclosure can be implemented in various ways, some of which will be described in the following by way of example.

Firstly, a method of manufacturing a semiconductor device according to an embodiment of the present disclosure is described with reference to FIGS. 1-12.

As shown in FIG. 1, a substrate 100 is provided. The substrate 100 may comprise any suitable substrate, including, but not limited to, a bulk semiconductor substrate such as a bulk Si substrate, a Semiconductor On Insulator (SOI) substrate, and the like. In the following, the substrate is described as a bulk Si substrate for convenience. On the substrate 100, Shallow Trench Isolations (STIs) 102 can be formed to isolate active regions of individual devices. For example, the STIs 102 may comprise oxide (e.g., silicon oxide). In the following, formation of a single one device is described for convenience. However, it is to be noted that the present disclosure is not limited thereto, and is also applicable to formation of two or more devices.

Figure 2:
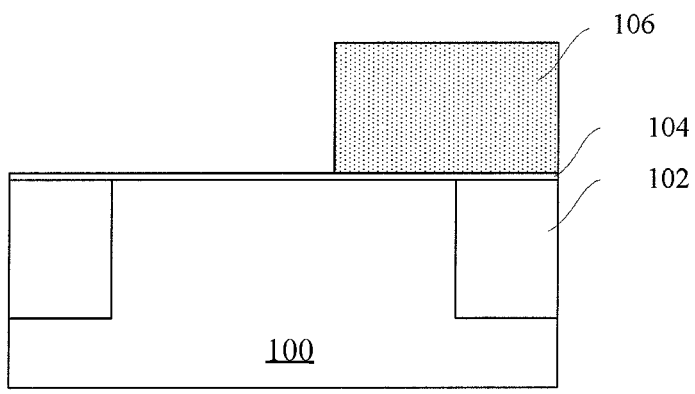

Next, as shown in FIG. 2, a thin oxide layer (e.g., silicon oxide) 104 is optionally formed on a surface of the substrate 100 by way of e.g. deposition. For example, the oxide layer 104 may have a thickness of about 5-10 nm, and can be used to form an Interfacial Layer (IL) subsequently. On the substrate 100 (or on the oxide layer 104 in the case where the oxide layer 104 is formed), a first shielding sub-layer 106 with a thickness of e.g. about 100-200 nm can be formed by way of e.g. deposition. For example, the first shielding layer 106 may comprise nitride (e.g. silicon nitride). The first shielding layer 106 can be patterned by way of e.g. Reactive Ion Etching (RIE) to cover a portion of the active region (which portion substantially corresponds to a later formed source or drain region).

Figure 3:
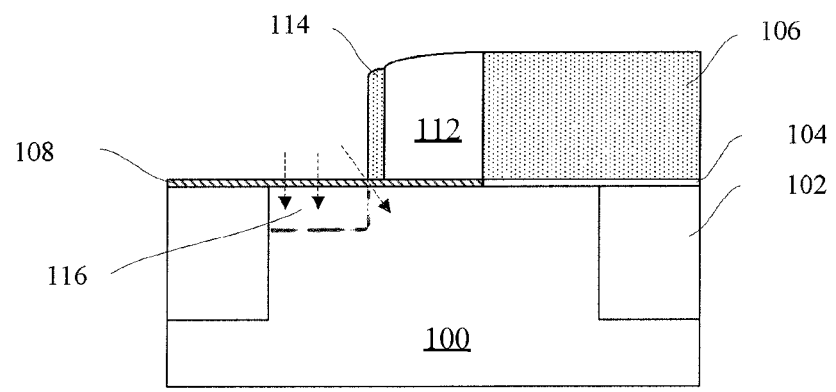

In the case where the oxide layer 104 is formed, the oxide layer 104 can be selectively etched with respect to the first shielding sub-layer 106 (e.g., nitride) and the substrate 100 (e.g., bulk Si), to form an IL 108 with a thickness of e.g. about 0.5-1 nm, as shown in FIG. 3. Here, the difference in thickness between the IL 108 and the oxide layer 104 is not shown for convenience of illustration.

Further, as shown in FIG. 3, a first sub-spacer 112 may be formed on a sidewall of the first shielding sub-layer 106. For example, the first sub-spacer 112 is formed to have a width of about 5-50 nm to cover a portion of the active region (which portion substantially corresponds to a later formed gate region). The first sub-spacer 112 may comprise polysilicon or amorphous silicon, for example. On a sidewall of the first sub-spacer 112, a second sub-spacer 114 may be formed. For example, the second sub-spacer 114 may comprise oxide (e.g., silicon oxide), with a dimension substantially corresponding to a gate spacer (e.g., with a width of about 5-20 nm). There are various ways to form the spacers, and detailed descriptions on formation of the spacers are omitted here.

Thus, the first sub-spacer 112 and the second sub-spacer 114 (which together constitute a "first spacer") and also the first shielding sub-layer 106 (which together constitute a "first shielding layer") expose a portion of the active region. Then, one of the source and drain regions can be formed in the exposed portion of the active region by way of a source/drain formation process. For example, this can be done as follows.

Specifically, as shown in FIG. 3 (especially, indicated by vertical arrows shown therein), extension implantation can be carried out to form an extension region 116. For example, for a p-type device, the implantation can be done by implanting p-type impurities such as In, $BF_2$ or B; for an n-type device, the implantation can be done by implanting n-type impurities such as As or P, to form the extension region. It is to be noted that the dashed line block 116 in FIG. 3 is shown as a regular rectangular shape for convenience of illustration. In practice, the profile of the extension region 116 depends on the process, and may have no definite boundaries. Further, to improve the performance, halo implantation can be carried out before the extension implantation, as indicated by angled arrows in FIG. 3. For example, for a p-type device, the implantation can be done by implanting n-type impurities such as As or P; for an n-type device, the implantation can be done by implanting p-type impurities such as In, $BF_2$ or B, to form a halo region (not shown).

Figure 4:
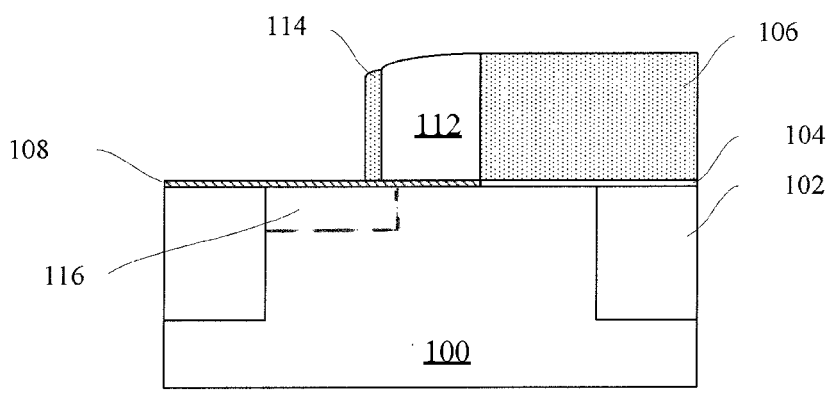

Next, as shown in FIG. 4, annealing, such as spike annealing, laser annealing, and flash annealing, can be performed to activate the implanted impurities. As a result, the extension region 116 may have an overlap with a channel region to be formed.

Figure 5:
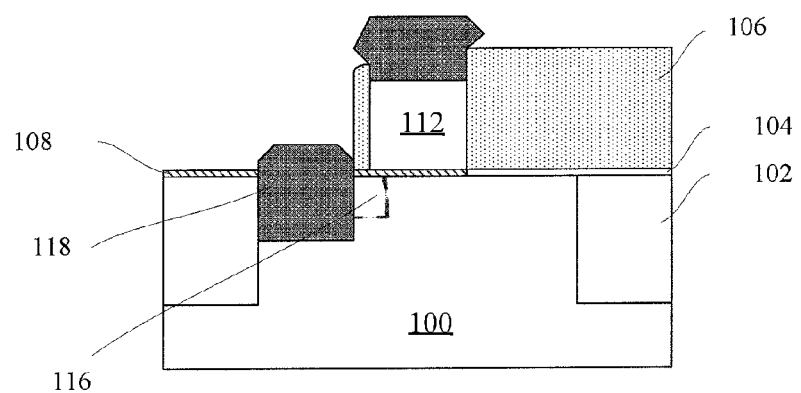

According to an embodiment of the present disclosure, it is possible to form a stressed source/drain, to improve the performance of the device. For example, such a stressed source/drain can be formed as shown in FIG. 5. Specifically, the substrate 100 can be selectively etched, using the first shielding layer as a mask. Then, a source/drain region 118 can be formed on the etched substrate 100 by way of e.g. epitaxy. For example, the source/drain region 118 may comprise a semiconductor material different in composition from the substrate 100, so that it can apply stress due to mismatch of their lattice constants. For a p-type device, the source/drain region 118 may be compressive-stressed; and for an n-type device, the source/drain region 118 may be tensile-stressed. For example, in a case where the substrate 100 comprises bulk Si, the source/drain region 118 may comprise SiGe (where an atomic percentage of Ge is about 15-75%, for example) for a p-type device, and Si:C (where an atomic percentage of C is about 0.2-2%, for exmaple) for an n-type device. The source/drain region 108 can be doped in situ while being grown to a proper conductivity type.

It is apparent for those skilled in the art that there are various ways to form such a stressed source/drain, and detailed descriptions thereof are omitted.

In this example, because the first sub-spacer 112 comprises polysilicon or amorphous silicon, there may be a layer having the same material as the source/drain 108 grown on top of the first sub-spacer 112.

Figure 6:
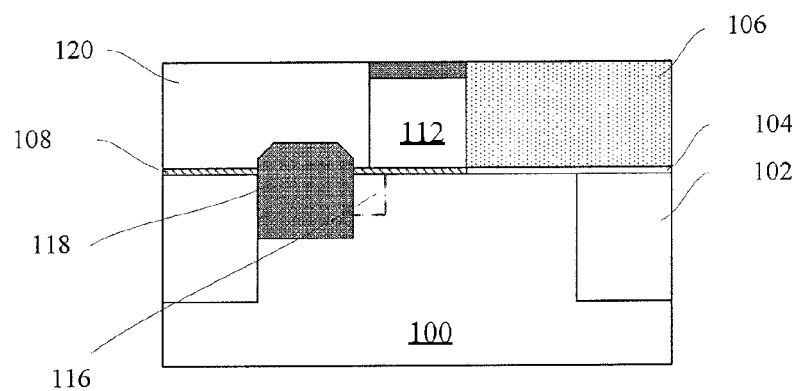

Next, as shown in FIG. 6, a second shielding sub-layer 120 may be formed on the substrate 100, to cover at least the above formed one of the source and drain regions. For example, the second shielding sub-layer 120 may comprise oxide (e.g., silicon oxide). Then, a planarization process such as Chemical Mechanical Polishing (CMP) can be performed to expose the first shielding layer (including the first shielding sub-layer 106, the first sub-spacer 112 and the second sub-spacer 114) to facilitate following processes. Here, it is to be noted that the epitaxial layer on top of the first sub-spacer 112, which is shown in the drawing though, may be completely removed by the CMP.

Preferably, the second sub-spacer 114 may be removed before formation of the second shielding sub-layer 112. For example, the second sub-spacer 114 can be removed by selectively etching the nitride. Because the thickness (for example, about 100-200 nm) of the first shielding sub-layer 116 is much greater than the width (for example, about 5-20 nm) of the second sub-spacer 114, the process of removing the second sub-spacer 114 by selective etching has negligible impact on the first shielding sub-layer 116.

Figure 7:
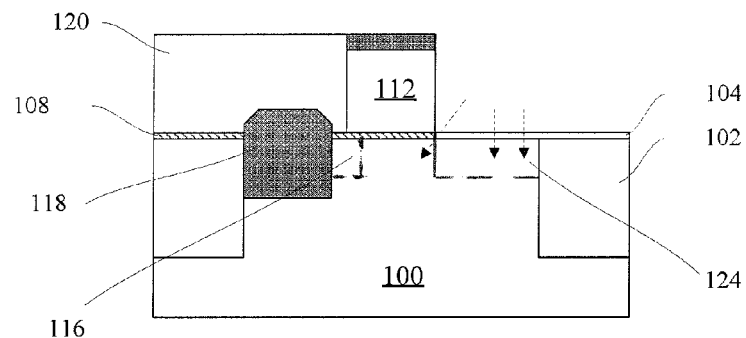

Subsequently, as shown in FIG. 7, the first shielding sub-layer 106 can be removed by selectively etching the first shielding sub-layer 106 (e.g., silicon nitride) with respect to the first sub-spacer 112 (e.g., polysilicon or amorphous silicon), and the second shielding sub-layer 120 and the oxide layer 104 (e.g., silicon oxide). The selective etching can be done by hot phosphoric acid, for example.

Thus, as shown in FIG. 7, the second shielding sub-layer 120 and the first sub-spacer 112 (which together constitute a "second shielding layer" as described above) expose a portion of the active region. Then, the other of the source and drain regions can be formed in the exposed portion of the active region by way of a source/drain formation process. For example, this can be done as follows.

Specifically, as shown in FIG. 7, extension implantation can be carried out to form an extension region 124. For example, for a p-type device, the implantation can be done by implanting p-type impurities such as In, $BF_2$ or B; for an n-type device, the implantation can be done by implanting n-type impurities such as As or P, to form the extension region. It is to be noted that the dashed line block 124 in FIG. 7 is shown as a regular rectangular shape for convenience of illustration. In practice, the profile of the extension region 124 depends on the process, and may have no definite boundaries. Further, to improve the performance, halo implantation can be carried out before the extension implantation. For example, for a p-type device, the implantation can be done by implanting n-type impurities such as As or P; for an n-type device, the implantation can be done by implanting p-type impurities such as In, $BF_2$ or B, to form a halo region (not shown).

Figure 8:
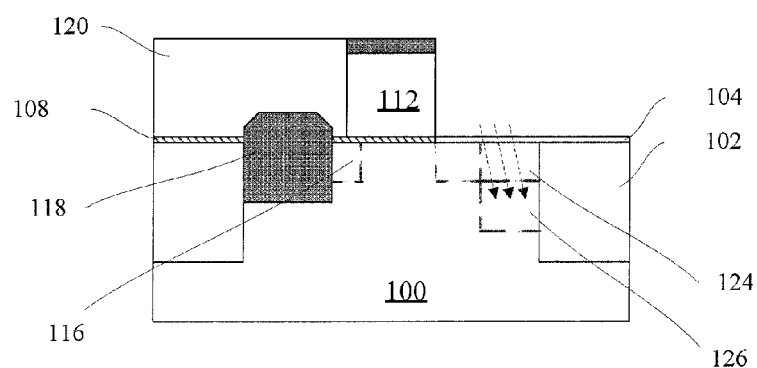

After that, as shown in FIG. 8, source/drain implantation can be done to form a source/drain implantation region 126. For example, for a p-type device, the implantation can be done by implanting p-type impurities such as In, $BF_2$ or B; for an n-type device, the implantation can be done by implanting n-type impurities such as As or P, to form the source/drain implantation region. It is to be noted that the dashed line block 126 in FIG. 8 is shown as a regular rectangular shape for convenience of illustration. In practice, the profile of the source/drain implantation region 126 depends on the process, and may have no definite boundaries.

Figure 9:
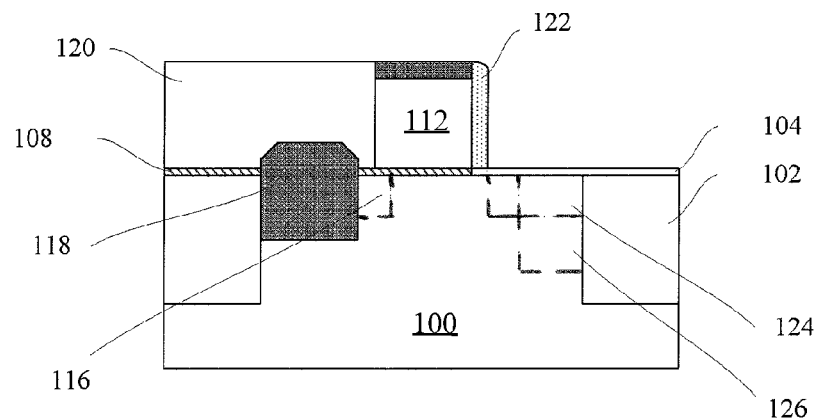

According to a further embodiment of the present disclosure, as shown in FIG. 9, a second spacer 122 may be formed on a sidewall of the first sub-spacer 112 before the source/drain formation process. For example, the second spacer 122 may comprise nitride (e.g., silicon nitride), with a dimension substantially corresponding to a gate spacer (e.g., with a width of about 5-20 nm). Thus, as shown in FIG. 9, the second shielding sub-layer 120, the first spacer (which, in this example, includes the first sub-spacer 112 because the second sub-spacer is removed), and the second spacer 122 (which together constitute a "second shielding layer") expose a portion of the active region. Then, the other of the source and drain regions can be formed in the exposed portion of the active region by way of a source/drain formation process. For example, the halo (not shown), the extension 124 and the source/drain implantation region 126 can be formed according to the process described above in conjunction with FIGS. 7 and 8.

Figure 10:
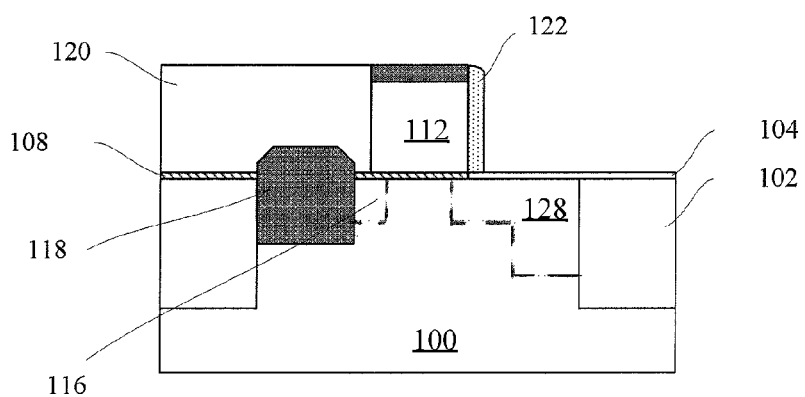

Next, as shown in FIG. 10, annealing, such as spike annealing, laser annealing, and flash annealing, can be performed to activate the implanted impurities, to form a final source/drain region 128.

Then, the second spacer 122 and the first sub-spacer 112 can be removed by selective etching. For example, the second spacer 122 (e.g., the silicon nitride) may be selectively removed by way of hot phosphoric acid, and the first spacer 112 (e.g., polysilicon or amorphous silicon) may be selectively removed by way of a TMAH solution. As a result, a relatively large space (substantially corresponding to the gate region+the other of the source and drain regions) is reserved on the side of the second shielding sub-layer 120, so that it is easy to form a gate stack.

Figure 11:
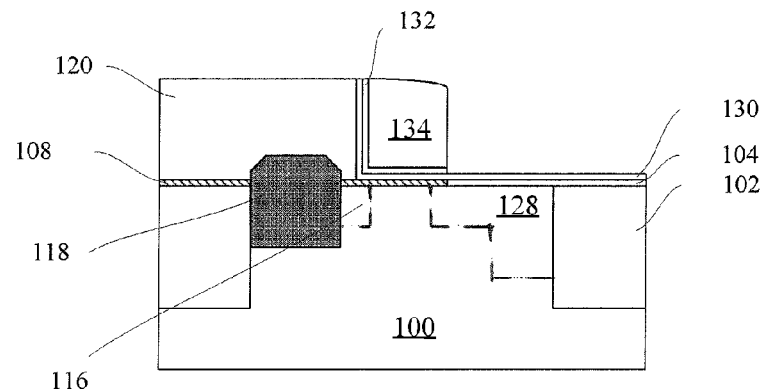

Then, as shown in FIG. 11, the gate stack can be formed. Specifically, a gate dielectric layer 130 can be formed by way of e.g. deposition. For example, the gate dielectric layer 130 may comprise a high-K gate dielectric material such as $HfO_2$, with a thickness of about 2-4 nm. Optionally, an IL can be rebuilt before formation of the gate dielectric layer 130. For example, the IL (not shown) can be formed by selectively etching the oxide layer 104, as described above with reference to FIG. 3. On the gate dielectric layer 130, a gate conductor 134 can be formed as a spacer. In formation of the gate conductor, parameters adopted in the spacer formation process, such as deposition thickness and RIE parameters, can be controlled to locate the gate conductor 134 as a spacer substantially between the underlying source and drain regions formed as described above. For example, the gate conductor 134 may comprise a metal gate conductor material, such as Ti, Co, Ni, Al, W, or any alloy thereof. Preferably, there may be a work function adjustment layer 132 sandwiched between the gate dielectric layer 130 and the gate conductor 134. For example, the work function adjustment layer 132 may comprise any one of TaC, TiN, TaTbN, TaErN, TaYbN, TaSiN, HfSiN, MoSiN, RuTa, NiTa, MoN, TiSiN, TiCN, TaAlC, TiAlN, TaN, PtSi, $Ni_3Si$, Pt, Ru, Ir, Mo, HfRu, $RuO_x$, or any combination thereof, with a thickness of about 2-10 nm.

Figure 12:
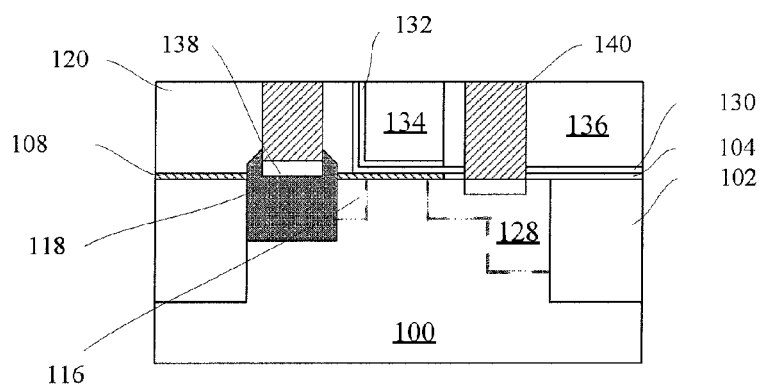

After that, as shown in FIG. 12, an interlayer dielectric layer 136 can be formed by way of e.g. deposition, and planarized by way of e.g., CMP. The dielectric layer 136 may comprise oxide (e.g., silicon oxide), nitride or any combination thereof. Then, contacts 140 corresponding to the source and drain regions can be formed. For example, the contacts 140 may comprise metal such as W or Cu. According to an embodiment, to improve the ohmic contact, a metal silicide layer 138 may be formed in the source and drain regions, so that the contacts 140 are in electrical contact with the source and drain regions via the metal silicide layer 138. For example, the metal silicide layer 138 may comprise NiPtSi. There are various ways to form the metal silicide layer 138 and the contacts 140, and detailed descriptions thereof are omitted here.

Thus, an illustrative semiconductor device according to the present disclosure is achieved. As shown in FIG. 12, the semiconductor device may comprise the source and drain regions (118, 128) and the gate stack (130, 132, 134) formed on the substrate. The gate stack, especially, the gate conductor 134, is formed as a spacer on the sidewall of the shielding layer (or a dielectric layer) 120 on one side (the left side in the example shown in FIG. 12) of the gate stack. The source/drain region 118 on this side (the left side in the example shown in FIG. 12) can be stressed.

Next, a method of manufacturing a semiconductor device according to a further embodiment of the present disclosure is described with reference to FIGS. 13-17. Similar or like reference symbols in FIGS. 13-17 denote similar or like components as those shown in FIGS. 1-12. In the following, descriptions are mainly directed to differences between this embodiment and the above described embodiments.

Figure 13:
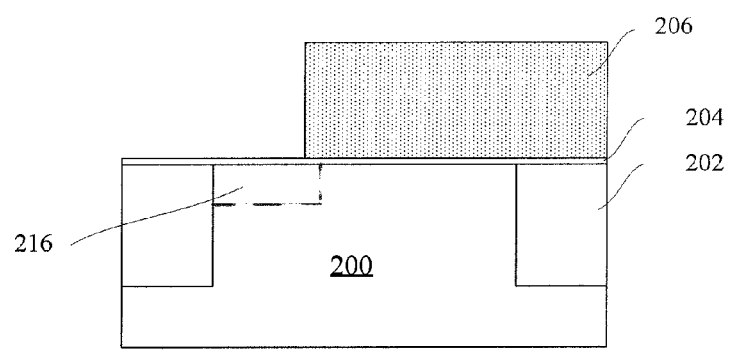
FIGS. 13-17 are schematic views showing a method of manufacturing a semiconductor device according to a further embodiment of the present disclosure.
Figure 14:
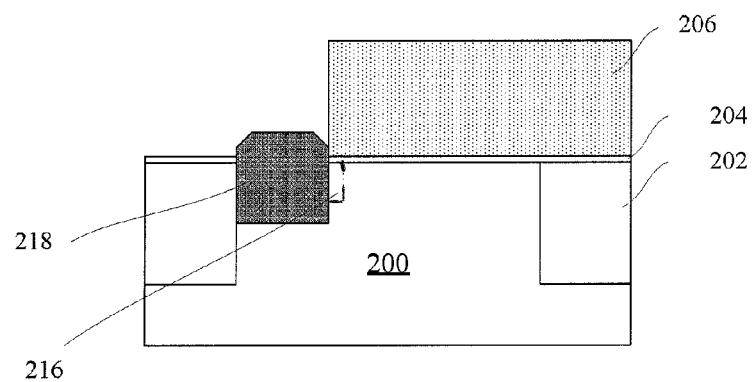

As shown in FIG. 13, a substrate 200 is provided. On the substrate 200, STIs 202 can be formed. Optionally, a thin oxide layer 204 is formed on a surface of the substrate 200. For details of the substrate 200 and the oxide layer 204, reference may be made to the above descriptions on the substrate 100 and the oxide layer 104 in conjunction with FIGS. 1-2.

On the substrate 200 (or on the oxide layer 204 in the case where the oxide layer 204 is formed), a first shielding layer 206 with a thickness of e.g. about 100-200 nm can be formed by way of e.g. deposition. For example, the first shielding layer 206 may comprise nitride (e.g. silicon nitride). The shielding layer 206 can be patterned by way of e.g. RIE to expose a portion of the active region (which portion substantially corresponds to a later formed source or drain region). Then, one of the source and drain regions can be formed in the exposed portion of the active region by way of a source/drain formation process. Preferably, the one of the source and drain regions can be stressed. For example, a halo region (not shown) and an extension region 216 can be formed according to the process described above in conjunction with FIGS. 3 and 4. For details of the halo region and the extension region 216, reference may be made to the above descriptions in conjunction with FIGS. 3 and 4. Then, the one of the source and drain regions 218 can be formed according to the process described above in conjunction with FIG. 5.

Figure 15:
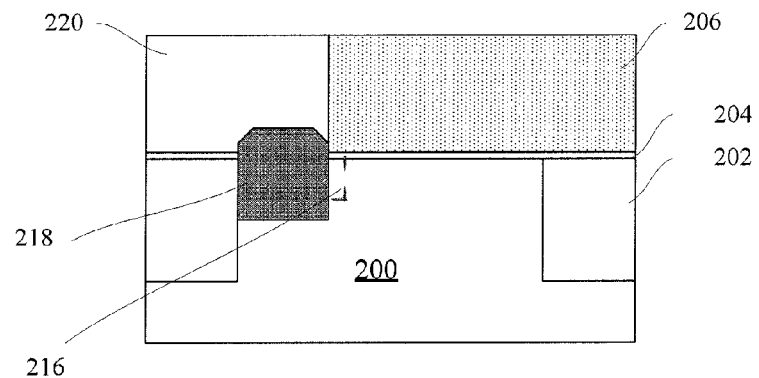

Next, as shown in FIG. 15, a second shielding sub-layer 220 may be formed on the substrate, to cover at least the above formed one of the source and drain regions. For example, the second shielding sub-layer 220 may comprise oxide (e.g., silicon oxide). Then, a planarization process such as CMP can be performed to expose the first shielding layer 206, which then can be removed by selective etching.

Figure 16:
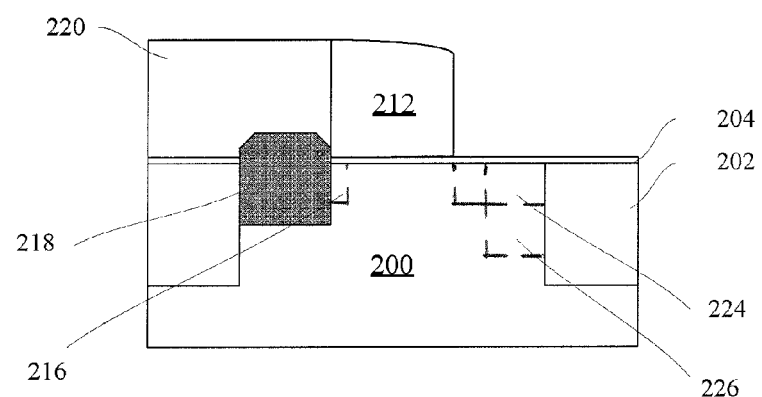

Then, as shown in FIG. 16, a first spacer 212 may be formed on a sidewall of the second shielding sub-layer 220. For example, the first spacer 212 may be formed to have a width of about 15-60 nm, to cover a portion of the active region (which portion substantially corresponds to a later formed gate region). The first spacer 212 may comprise polysilicon or amorphous silicon, for example.

Thus, the second shielding sub-layer 220 and the first spacer 212 (which together constitute a "second shielding layer") expose a portion of the active region. Then, the other of the source and drain regions can be formed in the exposed portion of the active region by way of a source/drain formation process. For example, a halo region (not shown), an extension region 224 and a source/drain implantation region 226 can be formed according to the process described above in conjunction with FIG. 9. For details of the halo region, the extension region 224 and the source/drain implantation region 226, reference may be made to the above descriptions in conjunction with FIG. 9.

Figure 17:
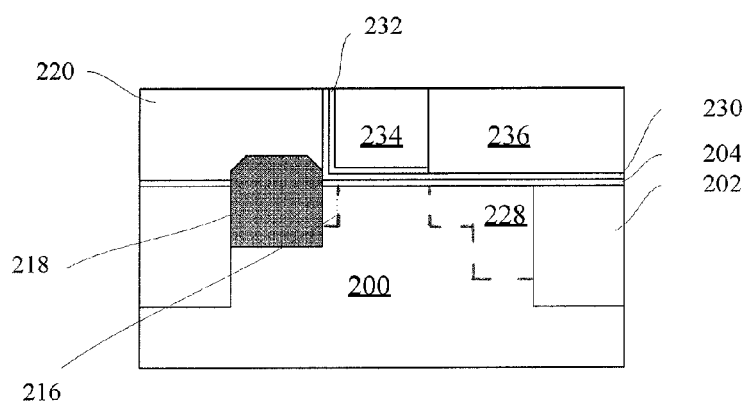

Next, as shown in FIG. 17, annealing, such as spike annealing, laser annealing, and flash annealing, can be performed to activate the implanted impurities, to form a final source/drain region 228.

Subsequently, the first spacer 212 can be removed by selective etching. For example, the first spacer 212 (e.g., polysilicon or amorphous silicon) may be selectively removed by way of a TMAH solution. As a result, a relatively large space (substantially corresponding to the gate region+the other of the source and drain regions) is reserved on the side of the second shielding sub-layer 220, so that it is easy to form a gate stack. For example, a gate dielectric layer 230, a work function adjustment layer 232, and a gate conductor 234 as a spacer can be formed sequentially (as described above in conjunction with FIG. 11). The device shown in FIG. 17 is substantially same in structure as the device shown in FIG. 11. After that, an interlayer dielectric layer 236 can be deposited and planarized, and peripheral components such as contacts can be formed. Detailed descriptions thereof are omitted here.

Though the above descriptions in conjunction with the embodiment shown in FIGS. 13-17 do not involve an IL, operations for forming the IL can be done as described in the above embodiments.

Figure 18:
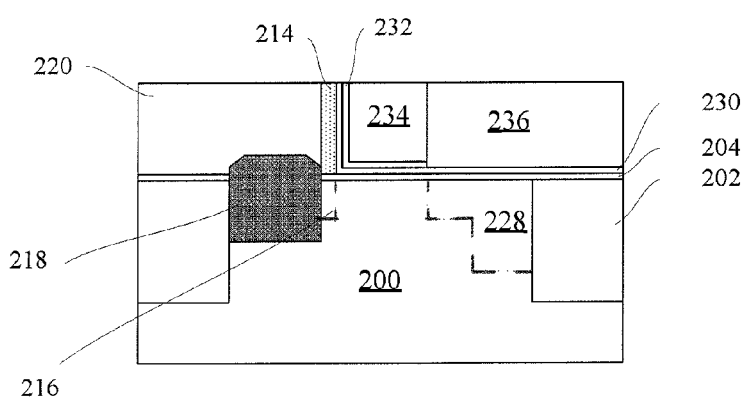
FIG. 18 is a schematic view showing a semiconductor device according to a further embodiment of the present disclosure.

FIG. 18 is a schematic view showing a semiconductor device according to a further embodiment of the present disclosure. The semiconductor device shown in FIG. 18 differs from that shown in FIG. 17 in that: the gate stack, especially, the gate conductor 234, is formed as a spacer on a sidewall of a second spacer 214 on one side (the left side in the example shown in FIG. 18) of the gate stack.

The device shown in FIG. 18 can be manufactured according to the process described above with reference to FIGS. 13-17. For example, the second spacer 214 can be additionally formed on the sidewall of the second shielding sub-layer 220 after the first spacer 212 is removed (referring to the above descriptions in conjunction with FIG. 17). For example, the second spacer 214 may comprise nitride (e.g., silicon nitride), with a thickness of about 5-20 nm. Alternatively, the second spacer 214 may be formed by the first shielding layer 206 which is partially removed in the process of removing the first shielding layer 206 (referring to the above descriptions in conjunction with FIG. 15), or may be formed on a sidewall of the second shielding sub-layer 220 in which case the first spacer 212 is formed on a sidewall of the second spacer 214 (referring to FIG. 16).

Next, a method of manufacturing a semiconductor device according to a further embodiment of the present disclosure is described with reference to FIGS. 19-23. Similar or like reference symbols in FIGS. 19-23 denote similar or like components as those shown in FIGS. 1-12. In the following, descriptions are mainly directed to differences between this embodiment and the above described embodiments.

Figure 19:
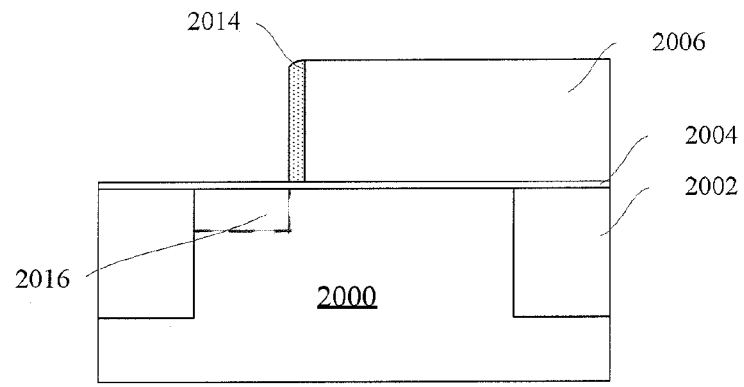
FIGS. 19-23 are schematic views showing a method of manufacturing a semiconductor device according to a further embodiment of the present disclosure.

As shown in FIG. 19, a substrate 2000 is provided. On the substrate 2000, STIs 2002 can be formed. Optionally, a thin oxide layer 2004 is formed on a surface of the substrate 2000. For details of the substrate 2000 and the oxide layer 2004, reference may be made to the above descriptions on the substrate 100 and the oxide layer 104 in conjunction with FIGS. 1-2.

On the substrate 2000 (or on the oxide layer 2004 in the case where the oxide layer 2004 is formed), a first shielding sub-layer 2006 with a thickness of e.g. about 100-200 nm can be formed by way of e.g. deposition. For example, the first shielding sub-layer 2006 may comprise oxide (e.g. silicon oxide). On a sidewall of the first shielding sub-layer 2006, a first sub-spacer 2014 can be formed. For example, the first sub-spacer 2014 may comprise nitride (e.g., silicon nitride), with a dimension substantially corresponding to a gate spacer (e.g., with a width of about 5-20 nm).

Figure 20:
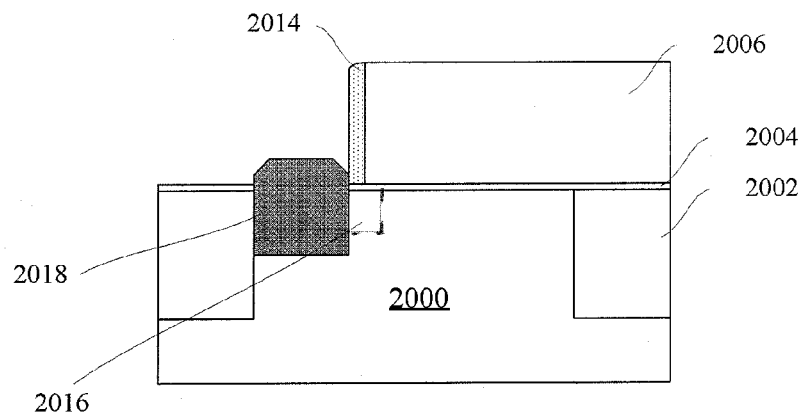

Thus, the first shielding sub-layer 2006 and the first sub-spacer 2014 (which together constitute a "first shielding layer") expose a portion of the active region (which portion substantially corresponds to a later formed source or drain region). Then, one of the source and drain regions can be formed in the exposed portion of the active region by way of a source/drain formation process. Preferably, the one of the source and drain regions can be stressed. For example, a halo region (not shown) and an extension region 2016 can be formed according to the process described above in conjunction with FIGS. 3 and 4. For details of the halo region and the extension region 2016, reference may be made to the above descriptions in conjunction with FIGS. 3 and 4. Then, the one of the source and drain regions 2018 can be formed according to the process described above in conjunction with FIG. 5, as shown in FIG. 20.

Figure 21:
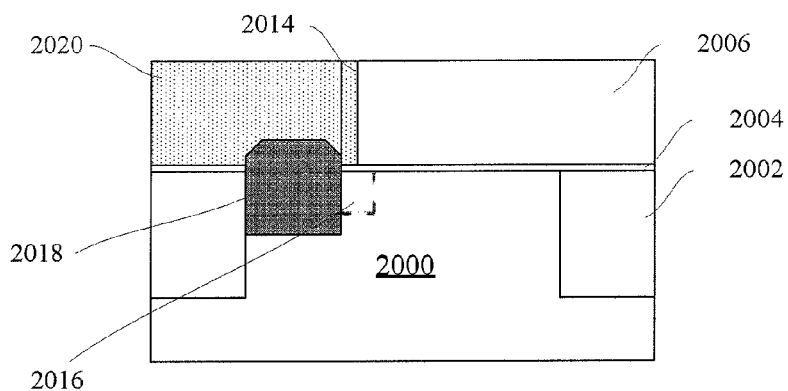

Next, as shown in FIG. 21, a second shielding sub-layer 2020 may be formed on the substrate, to cover at least the above formed one of the source and drain regions. For example, the second shielding sub-layer 120 may comprise nitride (e.g., silicon nitride). Then, a planarization process such as CMP can be performed to expose the first shielding sub-layer 2006 and the first sub-spacer 2014. The first shielding sub-layer 2006 can be removed by selective etching.

Figure 22:
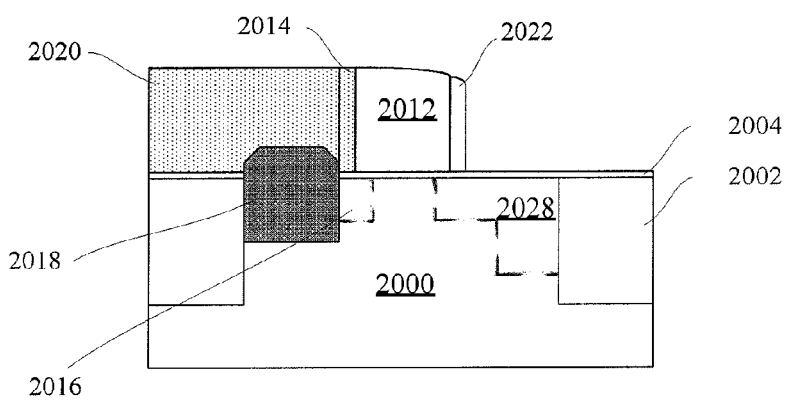
Figure 23:
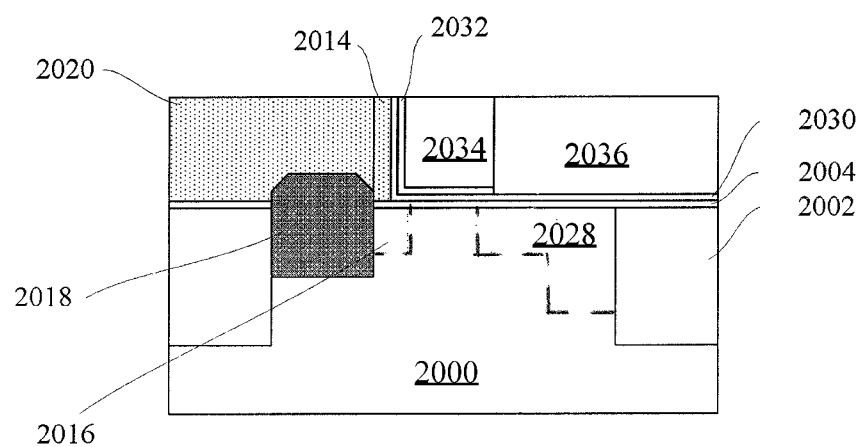

Subsequently, as shown in FIG. 22, a second sub-spacer 2012 may be formed on a sidewall of the first sub-spacer 2014. For example, the second sub-spacer 2012 is formed to have a width of about 5-50 nm to cover a portion of the active region (which portion substantially corresponds to a later formed gate region). The second sub-spacer 1012 may comprise polysilicon or amorphous silicon, for example. On a sidewall of the second sub-spacer 2012, a third sub-spacer 2022 may be formed. For example, the third sub-spacer 2022 may comprise oxide (e.g., silicon oxide), with a dimension substantially corresponding to a gate spacer (e.g., with a width of about 5-20 nm).

Thus, the second shielding sub-layer 2020, the first sub-spacer 2014, the second sub-spacer 2012, and the third sub-spacer 2022 (which together constitute a "second shielding layer") expose a portion of the active region. Then, the other of the source and drain regions can be formed in the exposed portion of the active region by way of a source/drain formation process. For example, a source/drain region 2028 can be formed according to the process described above in conjunction with FIGS. 9 and 10.

Subsequently, the second sub-spacer 2012 and the third sub-spacer 2022 can be removed by selective etching to leave the first sub-spacer 2014 remained. As a result, a relatively large space (substantially corresponding to the gate region+ the other of the source and drain regions) is reserved on the side of the first sub-spacer 2014, so that it is easy to form a gate stack.

The method can continue similarly to that shown in FIGS. 11 and 12, and detailed descriptions thereof are omitted here. For example, the gate stack (including a gate dielectric layer 2030, a work function adjustment layer 2032, and a gate conductor 2034 as a spacer) and an interlayer dielectric layer 2036 can be formed. The resultant device is similar to that shown in FIG. 12.

Though the above descriptions in conjunction with the embodiment shown in FIGS. 19-23 do not involve an IL, operations for forming the IL can be done as described in the above embodiments.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

While there have been shown and described and pointed out the fundamental novel features of the invention as applied to certain inventive embodiments, it will be understood that the foregoing is considered as illustrative only of the principles of the invention and not intended to be exhaustive or to limit the invention to the precise forms disclosed. Obvious modifications or variations are possible in light of the above teachings. The embodiments discussed were chosen and described to provide the best illustration of the principles of the invention and its practical application to enable one of ordinary skill in the art to utilize the invention in various embodiments and with various modifications as are suited to the particular use contemplate. All such modifications and variations are within the scope of the invention as determined by the appended claims when interpreted in accordance with the breadth to which they are entitled

What is claimed:

1. A semiconductor device, comprising:
   a substrate; and
   source and drain regions and a gate stack formed on the substrate,
   wherein the gate stack comprises:
      a gate dielectric layer; and
      a gate conductor, which is formed as a spacer on a sidewall of a dielectric layer or a gate spacer on one side of the gate stack,
   wherein the gate conductor has a first sidewall on the one side and a bottom surface thereof covered by the gate dielectric layer, and a second sidewall opposite to the first sidewall covered by a further dielectric layer different from the gate dielectric layer,
   wherein one of the source and drain regions is on the same side as the first sidewall with respect to the gate stack and another of the source and drain regions is on the same side as the second sidewall with respect to the gate stack,
   wherein the gate conductor faces a channel region defined between the source and drain regions via the gate dielectric layer on the bottom surface thereof, and
   wherein the one of the source and drain regions on the one side of the gate stack is stressed.

2. The semiconductor device according to claim 1, wherein the gate dielectric layer comprises a high-K dielectric material, and the gate conductor comprises a metal gate conductor material.

3. The semiconductor device according to claim 1, further comprising a work function adjustment layer disposed between the gate dielectric layer and the gate conductor.

4. The semiconductor device according to claim 1, wherein the one of the source and drain regions is compressive-stressed for a p-type device, or tensile-stressed for an n-type device.

5. The semiconductor device according to claim 4, wherein the substrate comprises Si, and the one of the source and drain regions comprises SiGe for the p-type device or SiC for the n-type device.

* * * * *